United States Patent
Liu et al.

(10) Patent No.: US 8,599,939 B2
(45) Date of Patent: Dec. 3, 2013

(54) DATA TRANSMISSION METHOD

(75) Inventors: Chaoyang Liu, Shenzhen (CN); Yibiao Fu, Shenzhen (CN); Yanming Li, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 248 days.

(21) Appl. No.: 13/001,048

(22) PCT Filed: Jul. 1, 2009

(86) PCT No.: PCT/CN2009/000741
§ 371 (c)(1),
(2), (4) Date: Dec. 23, 2010

(87) PCT Pub. No.: WO2010/000133
PCT Pub. Date: Jan. 7, 2010

(65) Prior Publication Data
US 2011/0096871 A1    Apr. 28, 2011

(30) Foreign Application Priority Data
Jul. 2, 2008    (CN) .......................... 2008 1 0127834

(51) Int. Cl.
*H04L 27/00*    (2006.01)
(52) U.S. Cl.
USPC ............ 375/259; 375/269; 375/279; 375/308
(58) Field of Classification Search
USPC .......... 375/259–264, 308, 279, 269, 330–333
See application file for complete search history.

(56) References Cited

U.S. PATENT DOCUMENTS

| | | | |
|---|---|---|---|
| 3,818,135 A * | 6/1974 | Tannhauser | .................. 332/104 |
| 7,020,154 B2 | 3/2006 | Van Der Ven | |
| 2002/0085576 A1 | 7/2002 | Van Der Ven | |
| 2005/0270185 A1 | 12/2005 | Esterberg | |

(Continued)

FOREIGN PATENT DOCUMENTS

| CN | 1404674 A | 3/2003 |
|---|---|---|
| CN | 101036363 A | 9/2007 |

(Continued)

OTHER PUBLICATIONS

Notification of the First Office Action of Chinese application No. 200810127834.3, issued on Sep. 15, 2010.

(Continued)

*Primary Examiner* — Qutbuddin Ghulamali
(74) *Attorney, Agent, or Firm* — Oppedahl Patent Law Firm LLC

(57) ABSTRACT

A data transmission method is disclosed, and the method comprises: encoding binary data to be transmitted with encoding principle as follows: encoding binary data x1 in the manner of no jumping at middle phase; encoding binary data x2 in the manner of jumping at middle phase; and after encoding two binary data x1 consecutively with high level of no jumping at middle phase, encoding the immediate following binary data x1 with low level of no jumping at middle phase; encoding binary data x1 with high level of no jumping at middle phase, wherein the binary data x1 follows binary data x1 encoded by using low level of no jumping at middle phase; and encoding binary data x1 immediately following binary data x2 by using high level of no jumping at middle phase; modulating the encoded data; and transmitting the modulated signal.

11 Claims, 6 Drawing Sheets

(56) References Cited

U.S. PATENT DOCUMENTS

| | | | |
|---|---|---|---|
| 2007/0152073 A1 | 7/2007 | Esterberg | |
| 2008/0205488 A1* | 8/2008 | Reefman et al. | 375/140 |
| 2011/0096871 A1* | 4/2011 | Liu et al. | 375/308 |

FOREIGN PATENT DOCUMENTS

| | | |
|---|---|---|
| CN | 101136051 A | 3/2008 |
| CN | 101136052 A | 3/2008 |
| CN | 101136058 A | 3/2008 |
| JP | 2006005651 A | 1/2006 |
| JP | 2006108833 A | 4/2006 |
| WO | 2004064346 A1 | 7/2004 |

OTHER PUBLICATIONS

Supplementary European Search Report in European application No. 09771903.3, mailed on Jun. 7, 2011.
Radio Frequency Identification for Item Management.
Impact of the Local Oscillator on Baseband Processing in RFID Transponder.
Rapid UHF RFID Silicon Debug and Production Testing.
Physical Layer Design Automation for RFID Systems.
International Search Report on international application No. PCT/CN2009/000741, mailed on Aug. 20, 2009.
English Translation of the Written Opinion of the International Search Authority in international application No. PCT/CN2009/000741, mailed on Aug. 20, 2009.

\* cited by examiner

DATA TRANSMISSION METHOD

TECHNICAL FIELD

The invention relates to a data transmission technology, and in particular, to a data transmission method.

BACKGROUND

Passive radio frequency identification (RFID) is a non-contact automatic identification technology, which can automatically identify a target object and acquire related data through a radio frequency signal without need of human intervention and can be applied to various harsh environments. The RFID technology can identify high-speed moving objects and simultaneously identify a plurality of tags, and be operated rapidly and conveniently.

The RFID technology adopts the following basic operating principle: a tag, after entering into a magnetic field, receives radio frequency signal from a reader, and sends product information (a passive tag) stored in a tag chip by means of energy acquired through induced current, or actively sends a signal at a certain frequency (a active tag); the reader reads and decodes the signal, and sends the decoded signal to an central information system for corresponding data processing.

In the passive RFID technology, the energy that a tag need for working is extracted from a signal of a reader. Therefore, certain measures are required to be taken for increasing the energy acquired at the tag end during the process that information transmits from the reader to the tag; one of the common method is to increase the time that signal operates from the reader to the tag, and another method is to use high level as much as possible and reduce the use of low level in a link from the reader to the tag during a data encoding process. For example, in the 18000-6 Type C of international organization for standardization (ISO), a pulse interval encoding (PIE) method is adopted.

The Manchester encoding method is a widely applied self-clocking coding method, which has the advantages of abundant timing and synchronization information carried during an encoding process, no DC drift, and simple encoding. The Manchester encoding method replaces each old binary code respectively with two new binary codes with different phases and is suitable for information transmission from a reader to a tag during radio frequency identification.

One of the encoding principles of the Manchester encoding method is as follows:

From 0 to 01 (a zero-phase periodic square wave);
From 1 to 10 (a π-phase periodic square wave).

During a specific implementation of the Manchester encoding method, data are distinguished by the change of wave electrical level; when the level changing from low to high, it indicates binary data "0"; when the level changing from high to low, it indicates binary data "1"; and a jump happens at the medium stage of a symbol period.

However, when the Manchester encoding method is used for transmitting data to a passive tag, the energy acquired by the passive tag is somewhat low.

SUMMARY

The invention aims to solve the technical problems by providing a data transmission method for increasing the energy of passive tag during RFID to overcome the disadvantages of the prior art.

To solve the above-mentioned problems, the invention provides a data transmission method, encoding binary data to be transmitted with encoding principle as follows, then modulating and transmitting the binary data.

Encoding binary data x1 in the manner of no jumping at middle phase; encoding binary data x2 in the manner of jumping at middle phase; and after encoding two binary data x1 consecutively with high level of no jumping at middle phase, encoding the immediate following binary data x1 with low level of no jumping at middle phase; and encoding binary data x1 with high level of no jumping at middle phase, wherein the binary data x1 follows binary data x1 encoded by using low level of no jumping at middle phase;

encoding binary data x1 immediately following binary data x2 by using high level of no jumping at middle phase;

Wherein, x1 and x2 are respectively 1 and 0; or, x1 and x2 are respectively 0 and 1.

Further, the encoding principle also includes: encoding a binary data x2 in the manner of jumping at falling edge, wherein the binary data x2 follows binary data x2 encoded in the manner of jumping at falling edge; encoding a binary data x2 in the manner of jumping at rising edge, wherein the binary data x2 follows binary data x2 encoded in the manner of jumping at rising edge.

Further, the encoding principle also includes: encoding binary data x1 and binary data x2 by adopting the same length.

Further, the encoding principle also includes: phase jumping at the left edge of binary data x2.

Further, the encoding principle also includes: encoding a binary data x2 in the manner of jumping at rising edge, wherein the binary data x2 follows binary data x1 encoded with high level of no jumping at middle phase.

Further, the encoding principle also includes: encoding a binary data x2 in the manner of jumping at falling edge, wherein the binary data x2 follows binary data x1 encoded with low level of no jumping at middle phase.

Further, the encoding principle also includes: no phase jumping at the left edge of binary data x2.

Further, the encoding principle also includes: encoding a binary data x2 in the manner of jumping at falling edge, wherein the binary data x2 follows binary data x1 encoded with high level of no jumping at middle phase.

Further, the encoding principle also includes: encoding a binary data x2 in the manner of jumping at rising edge, wherein the binary data x2 follows binary data x1 encoded with low level of no jumping at middle phase.

In conclusion, compared with the Manchester encoding method, the encoding method for data transmission of the invention used in a link from a reader to a tag in RFID system can provide more energy for the tag on the premise of the bandwidth occupied by signal which is unchanged.

DETAILED DESCRIPTION

The following drawings and embodiments aim to serve as the further description for the invention.

Figure 1:
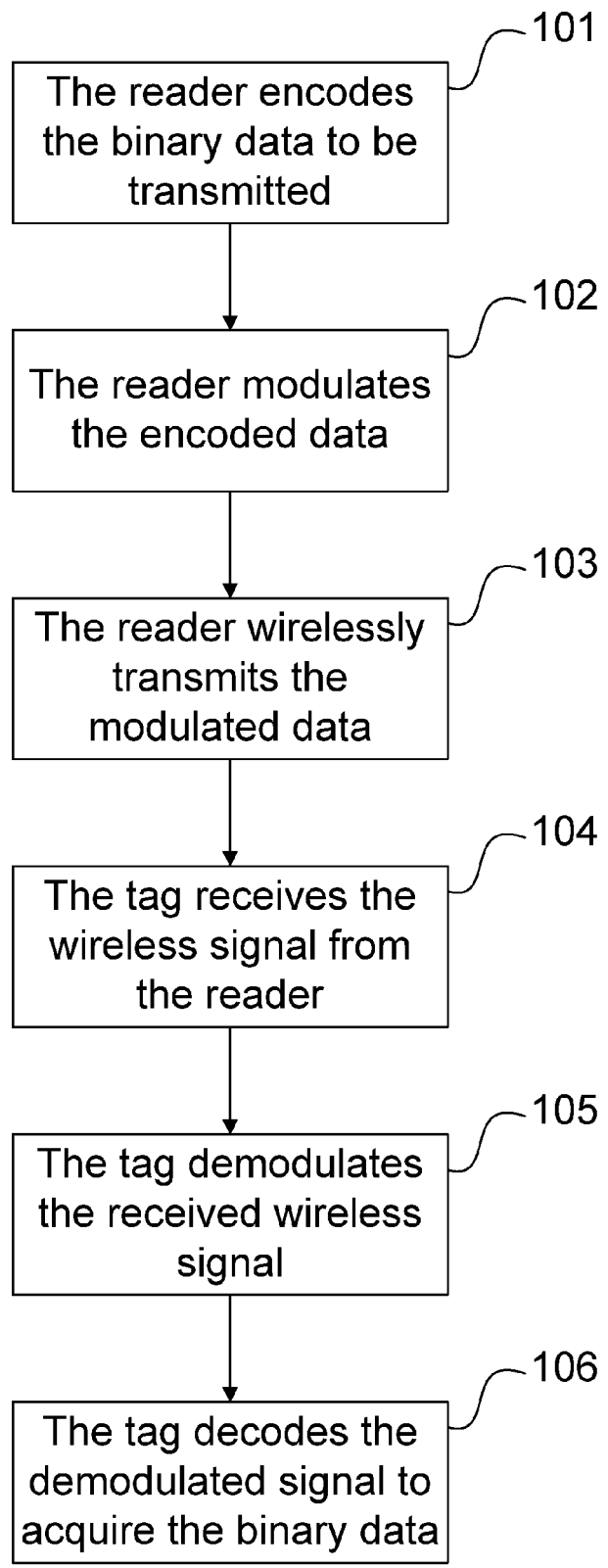
FIG. 1 is a flowchart of a data transmission method for radio frequency identification from a reader to a tag.

FIG. 1 is a flowchart of a data transmission method for radio frequency identification from a reader to a tag; the method mainly comprises the following steps:

Step 101: a reader encodes binary data that to be transmitted;

Step 102: the reader modulates the encoded data;

Step 103: the reader performs wireless transmission to the modulated signal;

Step 104: a tag receives the wireless signal from the reader;

Step 105: the tag demodulates the received wireless signal; and

Step 106: the tag decodes the demodulated signal to acquire the above-mentioned binary data.

The embodiments of the encoding principles for encoding original binary data to be transmitted in step 101 shall be described in details. The original binary data is hereinafter binary data for short.

Embodiment 1

The encoding principle 1 for encoding the original binary data to be transmitted includes the following contents:

1A: the length of encoded data that generated after binary data 1 and binary data 0 are encoded is the same; no jump happens to the middle phase of the binary data 1 in data symbols; a jump happens to the middle phase of the binary data 0 in data symbols, and a phase jump happens between two consecutive binary data 0;

1B: the binary data 1 is usually expressed with high level; after two or more binary data 1 are encoded consecutively with high level, the immediate following binary data 1 is encoded with low level, and the number of the binary data 1 that encoded consecutively with high level is rerecorded;

1C: binary data 1 following the binary data 1 that encoded with low level is encoded with high level.

In addition, to enhance the reliability of encoding codes and decoding codes, the following contents can be added to the encoding principle 1:

1D: on the premise of meeting the IA and the IB, i.e. using the high level as much as possible, a phase jump happens to the left edge of the binary data 0, and no phase jump happens to the right edge of the binary data 0.

The encoding principle 2 for encoding the original binary data that to be transmitted includes the following contents:

2A: the length of encoded data generated after binary data 1 and binary data 0 are encoded is the same; no jump happens to the middle phase of the binary data 0 in data symbols; a jump happens to the middle phase of the binary data 1 in data symbols; and a phase jump happens between two consecutive binary data 1;

2B: the binary data 0 is usually expressed with high level; after two or more binary data 0 are encoded consecutively with high level, the immediate following binary data 0 is encoded with low level, and the number of the binary data 0 that encoded consecutively with high level is rerecorded;

2C: the binary data 0 following the binary data 0 that encoded with low level is encoded with high level.

Similarly, to enhance the reliability of encoding codes and decoding codes, the following contents also can be added to the encoding principle 2:

2D: on the premise of meeting the 2A and the 2B, i.e. using the high level as much as possible, a phase jump happens to the left edge of the binary data 1, and no phase jump happens to the right edge of the binary data 1.

Figure 2:
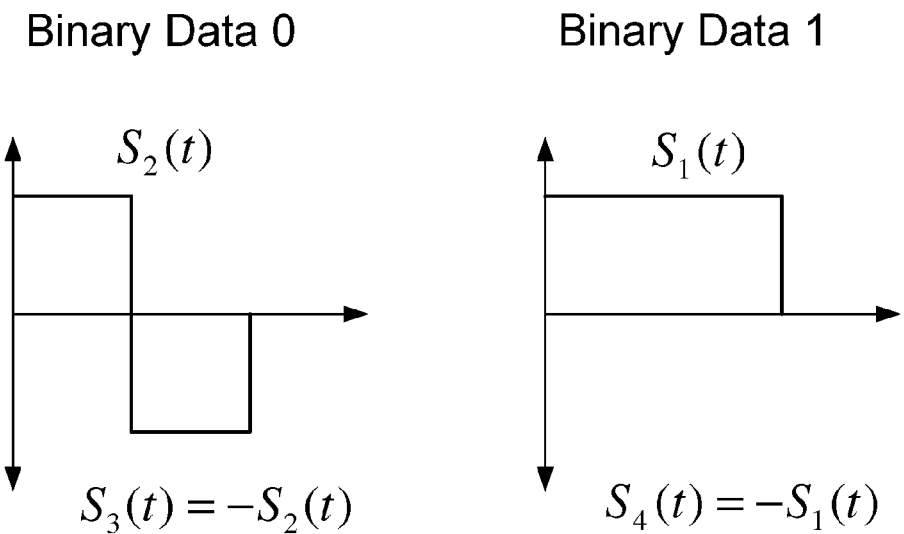
FIG. 2 is a schematic diagram illustrating the data state relation between binary data encoded by using the encoding principle 1 of the invention.

FIG. 2 is a diagram illustrating the data state relation between binary data encoded by using the encoding principle 1 of the invention. As shown in FIG. 2, a jump happens to the middle phase of binary data 0 in data symbols; no jump happens to the middle phase of binary data 1 in data symbols; the binary data 0 and the binary data 1 respectively have two states. The states of the binary data 0 are recorded as S2 and S3, and the states of the binary data 1 are recorded as S1 and S4.

If high level and low level are respectively expressed with '1' and '0', then S1 can be expressed as '11'; S2 can be expressed as '10', indicating a falling edge jump; S4 is opposite in phase to S1 and can be expressed as '00'; S3 is opposite in phase to S2 and can be expressed as '01', indicating rising edge jump.

When the encoding principle 2 of the invention is adopted, the binary data 1 and the binary data 0 in the state diagram that above-mentioned are only required to be interchanged. In this case, a jump happens to the middle phase of the binary data 1 in the data symbols; no jump happens to the middle phase of the binary data 0 in the data symbols. The states of the binary data 1 are recorded as S2 and S3, and the states of the binary data 0 are recorded as S1 and S4. S2 and S3 have opposite phases, and S1 and S4 have opposite phases.

Figure 3:
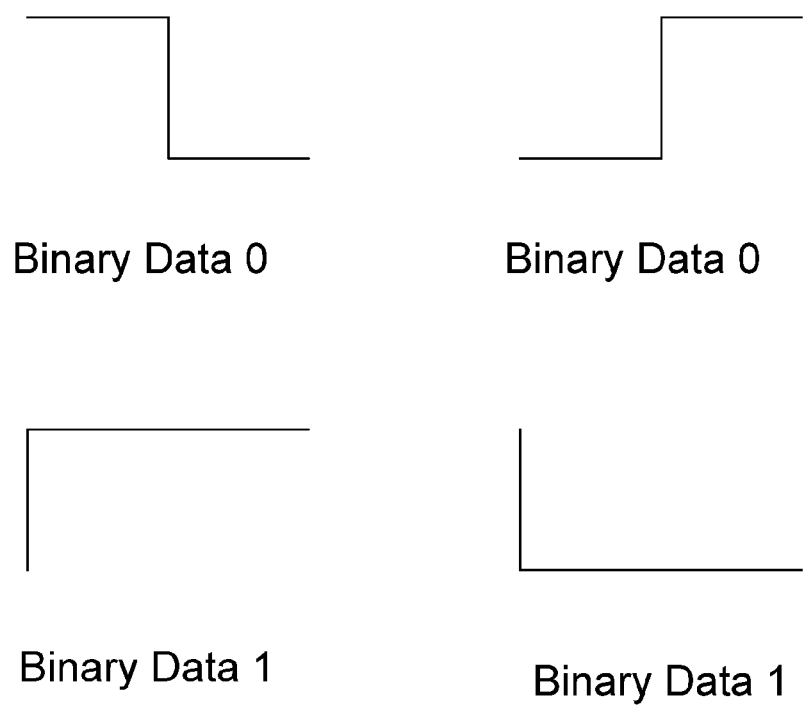
FIG. 3 is a schematic diagram illustrating data symbols when the encoding principle 1 of the invention is adopted.

FIG. 3 is a schematic diagram illustrating data symbols when the encoding principle 1 of the invention is adopted. As shown in FIG. 3, binary data 0 and binary data 1 respectively have two states. A jump happens to the middle phase of the binary data 0 in data symbols, and no jump happens to the middle phase of the binary data 1 in data symbols.

When the encoding principle 2 is adopted, the binary data 0 and the binary data 1 in FIG. 3 are only required to be interchanged. In this case, the binary data 0 and the binary data 1 respectively have two states, a jump happens to the middle phase of the binary data 1 in the data symbols, and no jump happens to the middle phase of the binary data 0 in the data symbols.

Figure 4:
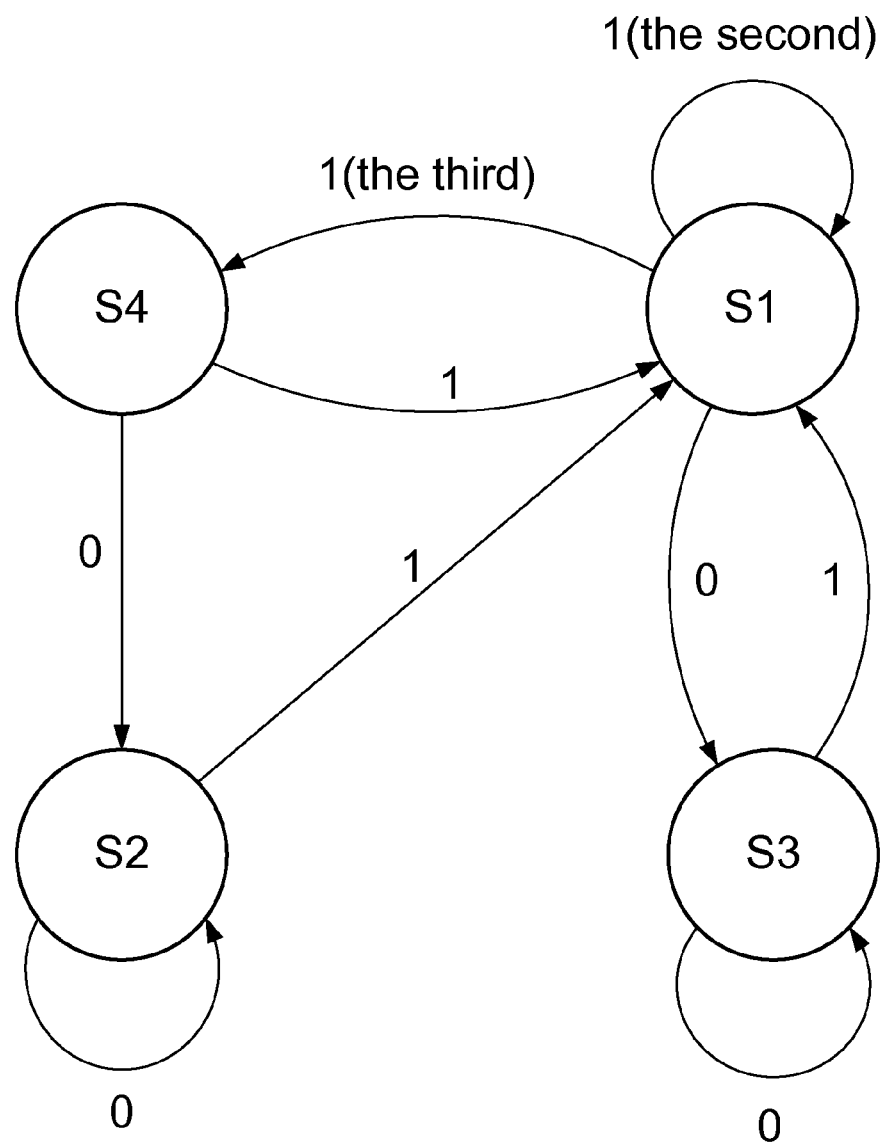
FIG. 4 is a data state transition diagram when the encoding principle 1 of the invention is adopted.

FIG. 4 is a data state transition diagram when the encoding principle 1 of the invention is adopted. As shown in FIG. 4, the state transition method using the encoding principle 1 is as follows:

When the binary data is now in a state of S1, i.e., the state is expressed as '11'.

When the binary data 1 is received: if the binary data corresponding to the current state is the first one (i.e., the previous state is non-S1 state) of consecutive binary data 1 (encoding with high level), the state S1 remains when another binary data 1 is received; if the binary data corresponding to the current state is the second one of consecutive binary data 1 (encoding with high level), the state is transited to S4 when another binary data 1 is received. That is to say, after two binary data 1 are encoded consecutively with high level, the third binary data 1 is encoded with low level, see 1B in the encoding principle 1.

When the binary data 0 is received: the state is transited to S3, see 1D in the encoding principle 1. As stated above, S1 can be expressed as '11', and S3 can be expressed as '01'; therefore, when the binary data 0 is received under the S1 state, the state is transited to S3 (i.e., encoding the binary data 0 using '01'), thus increasing phase jumps and enhancing the reliability of data transmission.

When the binary data is now in a state of S2, i.e., the state is expressed as '10'.

When the binary data 1 is received, the state is transited to S1; when the binary data 0 is received, the S2 state remains, see 1D in the encoding principle 1.

When the binary data is now in a state of S3, i.e., the state is expressed as '01':

When the binary data 1 is received, the state is transited to S1, see 1D in the encoding principle 1; when the binary data 0 is received, the S3 state remains, see 1D in the encoding principle 1.

That is to say, in order to make the most of high level for encoding, when the binary data 1 is received under the S3 state, '11' but '00' is used for encoding.

When the binary data is now in a state of S4, i.e., the state is expressed as '00'.

When the binary data 1 is received, the state is transited to S1, see 1C in the encoding principle 1; when the binary data 0 is received, the state is transited to S2, see 1D in the encoding principle 1. Similarly, S4 can be expressed as '00', S2 can be expressed as '10'; when the binary data 0 is received, the current state S4 is transited to S2 to increase phase jump and enhance the accuracy of data transmission.

It can be seen from FIG. 4 that there is no state transition relation between S2 and S3 and between S3 and S4, moreover, S2 cannot be transited to S4, thus code words have certain error detecting capability after the binary data is encoded by using the above-mentioned encoding principle 1.

When the encoding principle 2 is adopted, the states of the binary data 1 are denoted by S2 and S3, and the states of the binary data 0 are denoted by S1 and S4. The state transition diagram is similar to FIG. 4, and the transition condition is only required to change from receiving binary data 0 to receiving binary data 1 and to change from receiving binary data 1 to receiving binary data 0, the specific data transition method is not repeated here.

Figure 5:
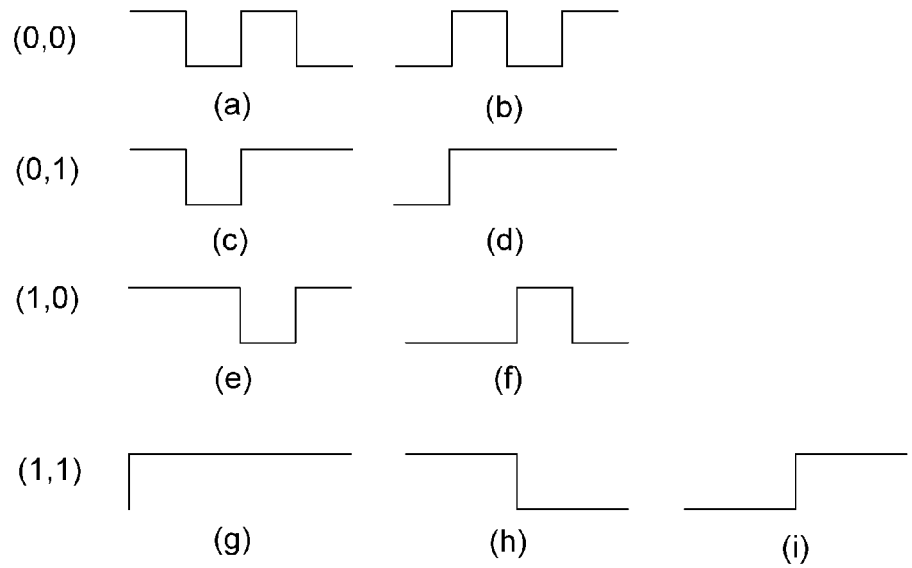
FIG. 5 is a data sequence diagram of two binary data encoded by using the encoding principle 1 of the invention.

FIG. 5 is a data sequence diagram of two binary data encoded by using the encoding principle 1 of the invention.

As shown in FIG. 5, binary data (0, 0), (0, 1) and (1, 0) respectively have two forms after being encoded;

binary data (1, 1) has the following three forms after being encoded: the form of FIG. 5(*g*) is the form of the consecutive first and the second encoded binary data 1 which follow binary data 0 or binary data 1 that encoded with low level; the form of FIG. 5(*h*) is the form of the consecutive second and the third encoded binary data 1 which follow binary data 0 or binary data 1 that encoded with low level; the form of FIG. 5(*i*) is the form of the consecutive third and the fourth encoded binary data 1 which follow binary data 0 or binary data 1 that encoded with low level;

The forms above are uniquely determined by encoding principle and initial data state.

When encoding principle 2 is adopted, the data sequence diagram is substantially the same, the binary data (0, 0) is only required to be changed into binary data (1, 1), the binary data (0, 1) is changed into binary data (1, 0), the binary data (1, 0) is changed into binary data (0, 1), and the binary data (1, 1) is changed into binary data (0, 0). In this way, the binary data (1, 1), (1, 0) and (0, 1) respectively have two forms after being encoded and the binary data (0, 0) has three forms after being encoded. The specific data sequence of two binary data encoded by using the encoding principle 1 of the invention is not repeated here.

Figure 6:
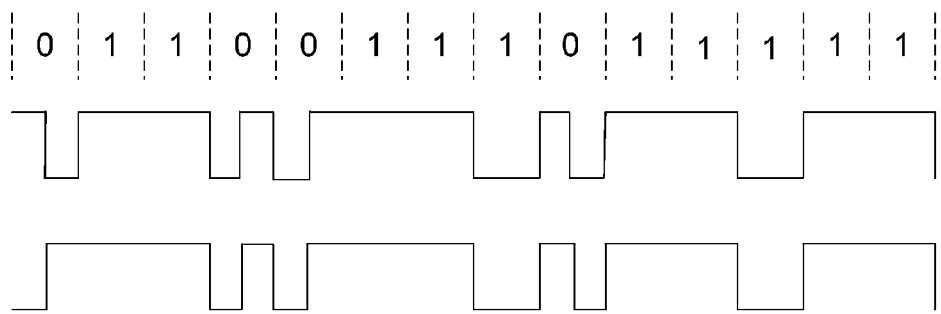
FIG. 6 is a schematic diagram illustrating an encoding example using the encoding principle 1 of the invention.

FIG. 6 is a diagram illustrating an encoding example using the encoding principle 1 of the invention. The diagrams above and below thereof respectively correspond to different initial states of the first binary data, wherein the first binary data 0 in the diagram above is encoded as '10' while the first binary data 0 in the diagram below is encoded as '01', and if encoding proceeds like this, the coding waveforms of the diagrams above and below tend to be identical along with the proceeding of the encoding.

Figure 7:
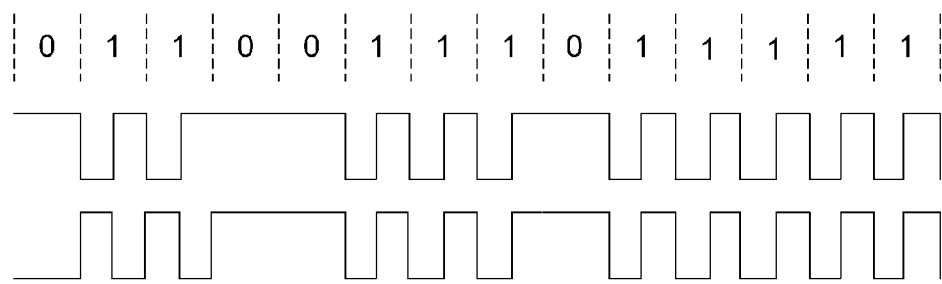
FIG. 7 is a schematic diagram illustrating an encoding example using the encoding principle 2 of the invention.

FIG. 7 is a diagram illustrating an encoding example using the encoding principle 2 of the invention. The diagrams above and below thereof respectively correspond to different initial states of the first binary data, wherein the first binary data 0 in the diagram above is encoded as '11' while the first binary data 0 in the diagram below is encoded as '00', and if encoding proceeds like this, the coding waveforms of the diagrams above and below tend to be identical along with the proceeding of the encoding.

Embodiment 2

The encoding principle 3 for encoding the original binary data to be transmitted includes the following contents:

3A: the length of encoded data that generated after binary data 1 and binary data 0 are encoded is the same; no jump happens to the middle phase of the binary data 1 in data symbols, a jump happens to the middle phase of the binary data 0 in data symbols, and a phase jump happens between two consecutive binary data 0;

3B: the binary data 1 is usually expressed with high level, after two or more binary data 1 are encoded consecutively with high level, the immediate following binary data 1 is encoded with low level, and the number of the binary data 1 that encoded consecutively with high level is rerecorded;

3C: the binary data 1 following the binary data 1 that encoded with low level is encoded with high level.

In addition, to enhance the reliability of encoding codes and decoding codes, the following contents can be added to the encoding principle 3:

3D: on the premise of meeting the 3A and the 3B, i.e. making the most of high level, no phase jump happens to the left edge of the binary data 0, and a phase jump happens to the right edge of the binary data 0.

The encoding principle 4 for encoding the original binary data to be transmitted includes the following contents:

4A: the length of encoded data that generated after binary data 1 and binary data 0 are encoded is the same; no jump happens to the middle phase of the binary data 0 in data symbols, a jump happens to the middle phase of the binary data 1 in data symbols, and a phase jump happens between two consecutive binary data 1;

4B: the binary data 0 is usually expressed with high level, after two or more binary data 0 are encoded consecutively with high level, the immediate following binary data 0 is encoded with low level, and the number of the binary data 0 that encoded consecutively with high level is rerecorded;

4C: the binary data 0 following the binary data 0 that encoded with low level is encoded with high level.

In addition, to enhance the reliability of encoding codes and decoding codes, the following contents can be added to the encoding principle 4:

4D: on the premise of meeting the 4A and the 4B, i.e. making the most of high level, no phase jump happens to the left edge of the binary data 1, and a phase jump happens to the right edge of the binary data 1.

A schematic diagram illustrating the data state relation between binary data that encoded by using the encoding principles 3 and 4 of the invention and a data sequence diagram when the encoding principles 3 and 4 of the invention are adopted are respectively the same as those when the encoding principle 1 and the encoding principle 2 are adopted, and they shall be respectively described in details.

Figure 8:
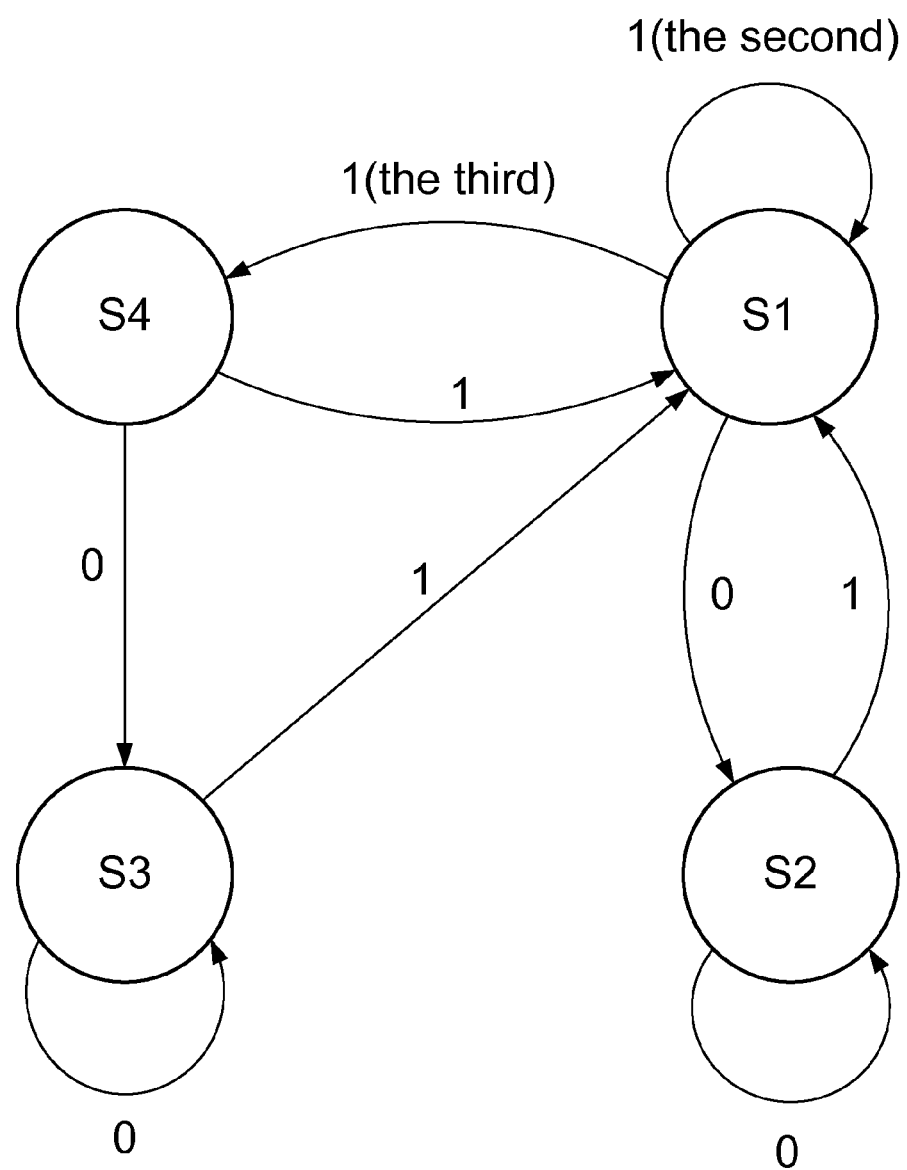
FIG. 8 is a data state transition diagram when the encoding principle 3 of the invention is adopted.

FIG. 8 is a data state transition diagram when the encoding principle 3 of the invention is adopted. As shown in FIG. 8, when the encoding principle 3 is adopted, the state transition method is as follows.

When the binary data is now in a state of S1, i.e., the state is expressed as '11'

When the binary data 1 is received: if the binary data corresponding to the current state is the first one (i.e., the previous state is non-S1 state) of consecutive binary data 1 (encoded with high level), the state S1 remains when another binary data 1 is received; if the binary data corresponding to the current state is the second one of consecutive binary data 1 (encoded with high level), the state is transited to S4 when another binary data 1 is received. That is to say, after two binary data 1 are encoded consecutively with high level, the third binary data 1 is encoded with low level, see 3B in the encoding principle 3.

When the binary data 0 is received: the state is transited to S2, i.e., from '11' to '10'; see 3D in the encoding principle 3.

When the binary data is now in a state of S2, i.e., the state is expressed as '10'.

When the binary data 1 is received, the state is transited to S1, see 3D in the encoding principle 3; when the binary data 0 is received, the state S2 remains, see 3A in the encoding principle 3.

When the binary data is now in a state of S3, i.e., the state is expressed as '01'.

When the binary data 1 is received, the state is transited to S1, i.e., making the most of high level; when the binary data 0 is received, the state S3 remains, see 3A in the encoding principle 3.

When the binary data is now in a state of S4, i.e., the state is expressed as '00'.

When the binary data 1 is received, the state is transited to S1, see 3C in the encoding principle 3; when the binary data 0 is received, the state is transited to S3, see 3D in the encoding principle 3.

It can be seen from FIG. 8 that there is no state transition relation between S2 and S3 and between S2 and S4; the state S1 cannot be transited into state S3, thus the code words have certain error detecting capability after the binary data is encoded by using the encoding principle.

Figure 9:
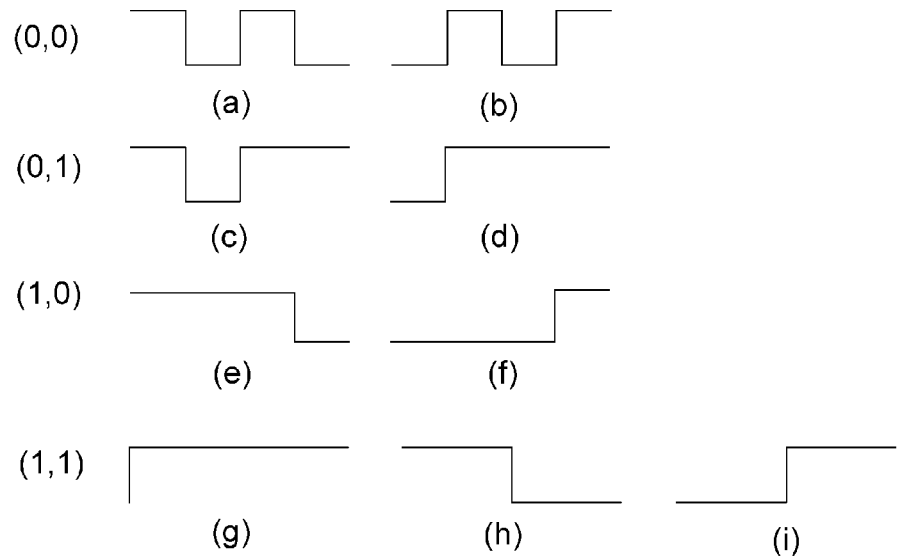
FIG. 9 is a data sequence diagram when two binary data are encoded by using the encoding principle 3 of the invention.

FIG. 9 is a data sequence diagram of two binary data encoded by using the encoding principle 3 of the invention.

As shown in FIG. 9, binary data (0, 0), (0, 1) and (1, 0) respectively have two forms after being encoded;

The binary data (1, 1) has the following three forms after being encoded: the form of FIG. 9(*g*) is the form of the consecutive first and the second encoded binary data 1 which follow binary data 0 or binary data 1 that encoded with low level; the form of FIG. 9(*h*) is the form of the consecutive second and the third encoded binary data 1 which follow binary data 0 or binary data 1 that encoded with low level; the form of FIG. 9(*i*) is the form of the consecutive third and the fourth encoded binary data 1 which follow binary data 0 or binary data 1 that encoded with low level;

The forms above are uniquely determined by encoding principle and the initial data state.

When the encoding principle 4 is adopted, the above-mentioned data sequence diagram is substantially the same, the binary data (0, 0) is only required to be changed into binary data (1, 1), the binary data (0, 1) is changed into binary data (1, 0), the binary data (1, 0) is changed into binary data (0, 1), and the binary data (1, 1) is changed into binary data (0, 0). In this way, the binary data (1, 1), (1, 0) and (0, 1) respectively have two forms after being encoded, and the binary data (0, 0) has three forms after being encoded. The specific data sequence of two binary data encoded by using the encoding principle 4 of the invention is not repeated here.

Figure 10:
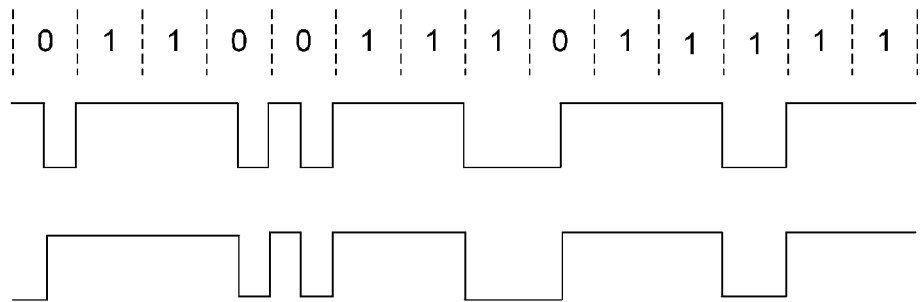
FIG. 10 is a schematic diagram illustrating an encoding example using the encoding principle 3 of the invention.

FIG. 10 is a diagram illustrating an encoding example using the encoding principle 3 of the invention. The diagrams above and below thereof respectively correspond to different initial states of the first binary data, wherein the first binary data 0 in the diagram above is encoded as '10' while the first binary data 0 in the diagram below is encoded as '01', and if encoding proceeds like this, the coding waveforms of the diagrams above and below tend to be identical along with the proceeding of the encoding.

Figure 11:
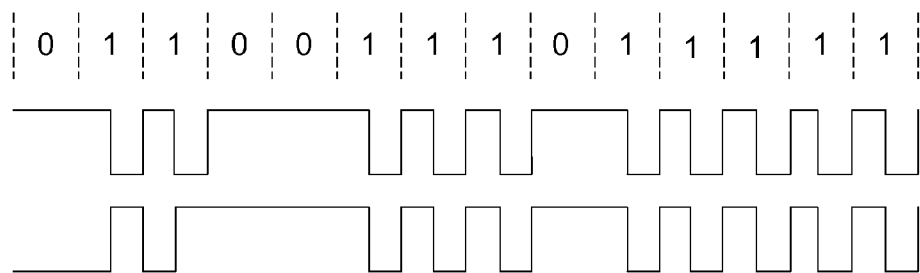
FIG. 11 is a schematic diagram illustrating an encoding example using the encoding principle 4 of the invention.

FIG. 11 is a diagram illustrating an encoding example using the encoding principle 4 of the invention. The diagrams above and below thereof respectively correspond to different initial states of the first binary data, wherein the first binary data 0 in the diagram above is encoded as '11' while the first binary data 0 in the diagram below is encoded as '00', and if encoding proceeds like this, the coding waveforms of the diagrams above and below tend to be identical along with the proceeding of the encoding.

Taking the encoding principle 1 as an example, a comparative analysis shall be performed between the encoding method of the invention and the Manchester encoding method in terms of the energy provided for a tag and the bandwidth occupied by a signal.

(1) Comparison on Energy Provided for a Tag

The more the number of '1' after binary data is encoded, the longer the high level continues, and the more the energy provided for the tag. When the binary data is encoded by using the Manchester encoding method, the duration time of the high level and that of the low level are the same, both of which respectively account for a half.

When binary data 0 is encoded, compare encoding principle 1 of the invention that is adopted with Manchester encoding method that is adopted, the duration time (length) of high level is the same; while as to binary data 1, after being encoded according to 1B, 1C and 1D in the encoding principle 1, the duration time (length) of high level is longer than that in the Manchester encoding method. Therefore, the encoding principle 1 provided by the invention is superior to the Manchester encoding method from the aspect of the energy provided for a tag.

The encoding principles 2, 3 and 4 of the invention also have the same effects.

(2) Analysis on Signal Bandwidth after Encoding

Refer to FIG. 2 for symbol waveforms representing binary data 1 and binary data 0, the symbolic expressions are assumed to be $g_1(t)$ and $g_0(t)$, the power spectrum of a random sequence formed by the encoding method of this invention is as follows:

$$P(w) = f_s p(1-p)|G_1(f) - G_0(f)|^2 + \sum_{m=-\infty}^{\infty} |f_s[pG_1(mf_s) + (1-p)G_0(mf_s)]|^2 \delta(f - mf_s) \quad (1)$$

In the expression, p denotes the transmission probability of $g_1(t)$, 1−p denotes the transmission probability of $g_0(t)$, $f_s$ denotes the speed of transmitting a symbol, and $G_1(f)$ and $G_0(f)$ respectively denote spectrum functions of $g_1(t)$ and $g_0(t)$. Wherein $$|G_1(f)| = T_s\left[\frac{\sin(\pi f T_s)}{\pi f T_s}\right] \quad (2)$$

$$|G_0(f)| = \frac{T_s}{2}\left[\frac{\sin\left(\pi f \frac{T_s}{2}\right)}{\pi f \frac{T_s}{2}}\right] \quad (3)$$

In the expression (2) and the expression (3), $T_s$ denotes a symbol period, and $T_s=1/f_s$.

The bandwidth of a random sequence mainly depends on the spectrum function $G_0(f)$ or $G_1(f)$ of a single code element waveform, and the larger bandwidth thereof should be taken as the sequence bandwidth. The smaller the duty cycle of a time waveform is, the wider the Frequency band is. Generally, the first zero point of a spectrum is taken as the approximate bandwidth of a rectangular pulse, it is the reciprocal of the pulse width τ, i.e., Bs=1/τ. As to a non-return-to-zero pulse, if τ=Ts, then Bs=fs; as to a half-duty-cycle return-to-zero pulse, if τ=Ts/2, then Bs=1/τ=2 fs.

It is clear that when the encoding principle 1 of the invention is adopted, after binary data 1 and binary data 0 are encoded, one is a non-return-to-zero pulse, and the other one is a half-duty-cycle return-to-zero pulse, thus the bandwidth occupied by a signal after encoding is 2 fs; when the Manchester encoding method is adopted, binary data 1 and binary data 0 are both half-duty-cycle return-to-zero pulses after being encoded, thus the bandwidth occupied by a signal after encoding is also 2 fs.

Therefore, under the same data rate, the bandwidth occupied by a signal after encoding with encoding principle 1 of the invention is the same as that occupied by a signal after encoding with Manchester encoding method.

The encoding principles 2, 3 and 4 of the invention also have the same conclusions, thus, it is unnecessary to give more details.

From the analysis above, if the encoding method of the invention is applied to a link from a reader to a tag in RFID system, compare with the Manchester encoding method, more energy can be provided for a tag on the premise of the bandwidth occupied by a signal which is unchanged.

The above-mentioned are only preferable embodiments rather than limitations to the protection scope of the invention. To the skilled in the art, all modifications and changes based on the invention should not depart from the protection scope of the attendant claims of the invention.

INDUSTRIAL APPLICABILITY

Compared with the Manchester encoding method, the encoding method of the invention applied to a link from a reader to a tag in RFID system can provide more energy for a tag on the premise of the bandwidth occupied by a signal which is unchanged, thus having great industrial applicability.

What is claimed is:

1. A data transmission method, comprising: encoding binary data to be transmitted with following encoding principle, modulating the encoded binary data to obtain a wireless signal, and transmitting the wireless signal; wherein the encoding principle is:
   encoding a binary data x1 as a symbol in which there is no level transition in the middle; encoding a binary data x2 as a symbol in which there is a level transition in the middle; and
   for a series of binary data x1, encoding each of two or more consecutive binary data x1 as a high level symbol in which there is no level transition in the middle, and then encoding an immediate following binary data x1 as a low level symbol in which there is no level transition in the middle; and
   encoding a binary data x1, which immediately follows the binary data x1 encoded as the low level symbol in which there is no level transition in the middle, as the high level symbol in which there is no level transition in the middle; and
   encoding a binary data x1, which immediately follows a binary data x2, as a high level symbol in which there is no level transition in the middle,
   wherein the encoding principle further comprises:
   encoding a binary data x2, which immediately follows another binary data x2 encoded as a symbol in which there is a high-to-low level transition in the middle, as a symbol in which there is a high-to-low level transition in the middle; and
   encoding a binary data x2, which immediately follows another binary data x2 encoded as a symbol in which there is a low-to-high level transition in the middle, as a symbol in which there is a low-to-high level transition in the middle.

2. The data transmission method of claim 1, wherein after transmitting the wireless signal, the method further comprising: demodulating the received wireless signal, and then decoding the demodulated signal to obtain the binary data.

3. The data transmission method of claim 1, wherein x1 and x2 are respectively 1 and 0; or, x1 and x2 are respectively 0 and 1.

4. The data transmission method of claim 1, wherein
   the encoding principle further comprises: encoding binary data x1 and binary data x2 as symbols having a same time length.

5. The data transmission method of claim 1, wherein
   the encoding principle further comprises: encoding a binary data x2, which immediately follows a binary data x1, as a symbol in which there is a level transition at the left end.

6. The data transmission method of claim 5, wherein
   the encoding principle further comprises: encoding a binary data x2, which immediately follows a binary data x1 encoded as a high level symbol in which there is no level transition in the middle, as a symbol in which there is a low-to-high level transition in the middle.

7. The data transmission method of claim 5, wherein the encoding principle further comprises:
   encoding a binary data x2, which immediately follows a binary data x1 encoded as a low level symbol in which there is no level transition in the middle, as a symbol in which there is a high-to-low level transition in the middle.

8. The data transmission method of claim 1, wherein the encoding principle further comprises: encoding a binary data x2, which immediately follows a binary data x1, as a symbol in which there is no level transition at the left end.

9. The data transmission method of claim 8, wherein the encoding principle further comprises: encoding a binary data x2, which immediately follows a binary data x1 encoded as a high level symbol in which there is no level transition in the middle, as a symbol in which there is a high-to-low level transition in the middle.

10. The data transmission method of claim 8, wherein the encoding principle further comprises: encoding a binary data x2, which immediately follows a binary data x1 encoded as a low level symbol in which there is no level transition in the middle, as a symbol in which there is a low-to-high level transition in the middle.

11. The data transmission method of claim 1, wherein the encoding principle further comprises: encoding binary data x1 and binary data x2 as symbols having a same time length.

\* \* \* \* \*

UNITED STATES PATENT AND TRADEMARK OFFICE
CERTIFICATE OF CORRECTION

PATENT NO. : 8,599,939 B2  Page 1 of 1
APPLICATION NO. : 13/001048
DATED : December 3, 2013
INVENTOR(S) : Liu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 302 days.

Signed and Sealed this
Twenty-second Day of September, 2015

Michelle K. Lee
*Director of the United States Patent and Trademark Office*